United States Patent

Walsh

[15] 3,657,932

[45] Apr. 25, 1972

[54] FLEXIBLE CLEVIS CLUTCH CONNECTOR FOR PUSHBUTTON TUNER

[72] Inventor: Raymond I. Walsh, Prospect Heights, Ill.

[73] Assignee: Motorola, Inc., Franklin Park, Ill.

[22] Filed: Aug. 7, 1970

[21] Appl. No.: 61,993

[52] U.S. Cl. ....................74/10.33, 192/89 B, 334/7

[51] Int. Cl. ....................F16h 35/18

[58] Field of Search ..............74/10.33, 10.31, 10.29, 10.27, 74/10.37, 10.35; 192/89 B, 66; 334/7

[56] References Cited

UNITED STATES PATENTS

| | | | |
|---|---|---|---|
| 2,811,045 | 10/1957 | Thompson | 74/10.33 |
| 1,577,496 | 3/1926 | Sholberg | 192/66 X |

*Primary Examiner*—Milton Kaufman
*Attorney*—Mueller and Aichele

[57] ABSTRACT

A flexible clevis is utilized in a clutch mechanism of a pushbutton radio. The flexible clevis is formed of two pieces of resilient, spring-like metal parts connected together in a bow shape arrangement so that a pressure plate of the clutch mechanism connected thereto can move axially on the shaft so that the pressure plate will shift between engaged and disengaged positions, depending upon whether a manual control is used or whether a pushbutton control is used.

4 Claims, 7 Drawing Figures

Patented April 25, 1972

3,657,932

INVENTOR.
RAYMOND I. WALSH
BY Mueller & Aichele
ATTORNEYS.

FLEXIBLE CLEVIS CLUTCH CONNECTOR FOR PUSHBUTTON TUNER

BACKGROUND OF THE INVENTION

This invention relates generally to pushbutton control devices, and more particularly, to pushbutton mechanisms which provide for either manual selection or pushbutton selection of a positioning apparatus which, in turn, moves a tuning structure in a radio receiver so that the desired radio station is received. Many devices in use today incorporate a pushbutton system to permit rapid and convenient selection of certain preselected radio stations. One example of such an arrangement is a radio receiver of the type used in automobiles. It is usual for such receivers to include a manually operated tuning knob also so that the entire band of wave lengths for which the radio receiver is designed to operate can be tuned into the receiver without actuation of a pushbutton. This is generally the case because there are only five or so pushbuttons on a given radio receiver. The pushbutton mechanism operates the same variable tuning elements of the radio as does the manual tuning control and a common provision for tuning is the incorporation of a suitable disengageable mechanism so that the manual tuning knob is freed from connection with the variable tuning elements when a pushbutton is actuated to tune-in or select a preselected radio station. That is, as the tuner is operated by means of pushbutton actuation, the tuning knob will not rotate to cause possible inconvenience to the operator. Also, a substantial increase in mechanical load from the tuning knob structure will be incorporated if the tuning knob is not disengaged from mechanical coupling when one of the pushbuttons is used to tune the receiver. In fact, the gear reducing arrangement of the manual tuning controls may tend to render movement of the tuning element of the receiver, by other than the tuning knob, difficult, if not impossible.

SUMMARY OF THE INVENTION

Accordingly, an object of this invention is to provide an improved clutch arrangement for pushbutton tuners.

Another object of this invention is to provide a clutch arrangement for pushbutton tuners which is simple and efficient in operation and inexpensive to manufacture.

Briefly, the present invention includes a mechanism for control of positioning apparatus connected to one or more resonant circuits in a wave signal receiver, such as an automobile radio. The positioning apparatus is moved either by means of a manually rotatable control knob or by one of a series of pushbuttons, each for quickly and conveniently selecting a certain preselected radio station. Each pushbutton is coupled to a suitable disengaging mechanism, such as a clutch having a pressure plate for freeing the manually rotatable control knob from connection with the tuning mechanism when any one of the pushbuttons is actuated. This action will eliminate the undesirable mechanical loading afforded by the manual control knob so that the pushbutton mechanism can operate more freely and smoothly. Such pushbuttons will control slidably mounted rods or plungers to which are fastened memory cam members adapted to engage the positioning apparatus which includes an adjustable treadle bar arrangement to which the resonant circuits of the radio are mechanically coupled for tuning the radio as a result of positioning the treadle bar arrangement. The manually rotatable control knob is also coupled to the treadle bar through the clutch to position the same when the clutch is in the normally closed or engaged position. Under normal operation, the manually rotatable control knob is coupled to the positioning mechanism to tune the resonant circuits upon manipulation thereof to change frequencies of the radio receiver.

The end portion of each slidably mounted plunger is adapted to engage a cam surface or section formed on a single slidable plate, and each cam surface has an inclined portion and an arcuate portion along the edge of the slidable plate so that as any one of the plungers is moved into engagement therewith, and before the cam engages the treadle bar of the positioning mechanism, the slidable plate is displaced sufficient to cause an arm member thereof to disengage the manual tuning knob from the positioning mechanism by disengagement of the clutch. The cam sections on the plate are curved to provide continuous smooth response and gradual change in mechanical resistance as represented to the operator.

Most advantageously, the clutch mechanism includes a pressure plate member axially, slidably mounted on a shaft by means of a flexible clevis which has one end thereof firmly staked to the shaft so that the clevis and shaft rotate together. The flexible clevis is formed preferably of stamped parts of spring metal and fashioned in a somewhat bowed condition to collapse under a force exerted thereon by the slidable plate when one of the cam members is engaged with any one of the corresponding pushbutton plungers. When the clutch member is in its engaged condition, the clevis is fully expanded to apply maximum force between the clutch pressure plate and a friction material on the rear side of a crown gear. This crown gear cooperates with a spur gear fastened to a shaft of the control knob to provide a suitable gear reduction for easy tuning. When any pushbutton is actuated, the slidable plate with cam members formed thereon will collapse the flexible clevis to disengage the clutch member from the crown gear, thus removing the manual control knob from connection with the positioning mechanism. This action allows the pushbuttons to control the positioning mechanism with a minimum of effort as the tremendous forces required to operate a gear reduction arrangement in the reverse direction is eliminated.

DETAILED DESCRIPTION OF THE PREFERRED EMBODIMENT

Figure 1:
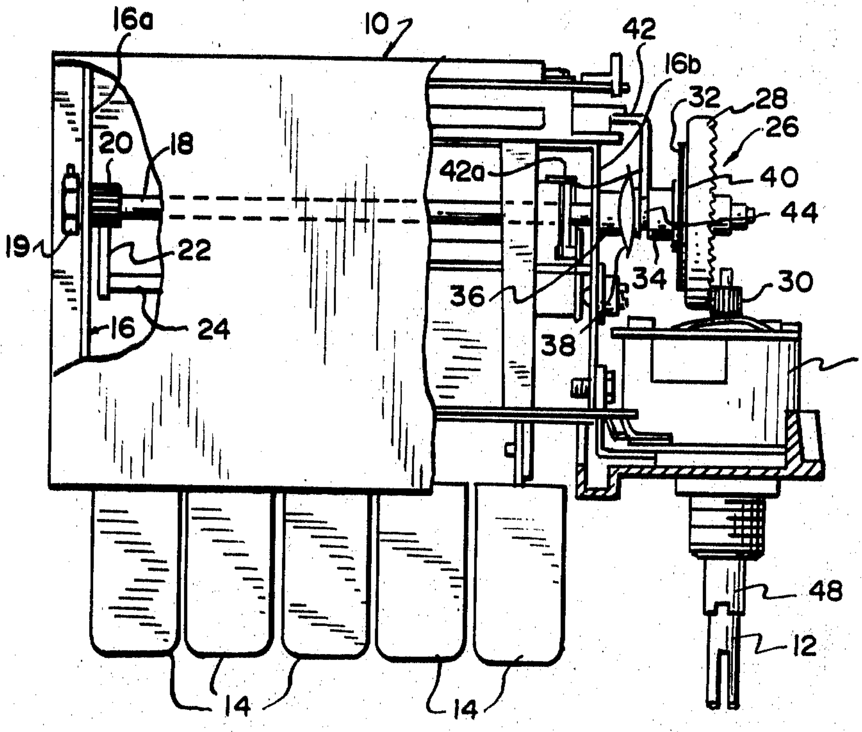
FIG. 1 is a top view of a portion of a radio tuning mechanism with portions thereof broken away to illustrate the flexible clevis arrangement of this invention.

Referring now to the drawings, it will be understood that like reference numerals throughout the several views of the drawings are intended to designate similar elements or components.

Referring now to FIG. 1, there is seen a fragmentary portion of a tuner of the pushbutton type commonly used in automobiles and is designated generally by reference numeral 10. The tuner portion 10 includes a manual drive shaft 12 which receives a control knob, not shown, to permit manual selection of any one of a plurality of radio stations capable of being received by the particular tuner involved. A plurality of pushbuttons 14 are provided at the front panel of the tuner for easy access by the user thereof so that any one of a corresponding number of preselected radio stations already set in the mechanical memory mechanism associated with the tuner can be recalled by simply pressing the pushbutton.

End wall portions 16a and 16b of a general support frame structure 16 rotatably receives a clutch shaft 18 to be held in position between the wall portions 16a and 16b by a locking collar 19 or the like. At one end of the shaft 18 is a pinion gear 20 engaging a mating gear segment 22 formed as part of a treadle bar assembly 24 of the type well-known in the art.

Rotation of the shaft 18 will cause movement of the treadle bar assembly 24 which, in turn, will position associated tuning coils connected thereto.

To provide a mechanical connection between the manual tuning shaft 12 and the clutch shaft 18, there is a clutch assembly 26 which includes a crown gear 28 engaging a mating spur gear 30. In this arrangement it will be noted that there is no universal joint, or similar device, interposed in the manual tuning shaft 12. The spur gear 30 is staked to the end of the manual drive shaft 12 and is a direct connection with the crown gear 28. The crown gear 28 is at all time in engagement with the spur gear 30, and by the novel arrangement of this invention these gears are not required to move relative to one another or together upon actuation of any one of the pushbuttons 14. A clutch pressure plate 32 is rotatably secured to the shaft 18, but axially movable with respect thereto this axial movement being within a limited range of movement as will be described in more detail hereinbelow. The clutch pressure plate 32 is fastened to a hub 34 which is slidable on the shaft 18 and which may be lubricated for reduced friction and wear for easy movement.

Most advantageously, the hub 34 is coupled to a hub 36 through a flexible clevis arrangement 38, and the hub 36 is fixedly secured to the shaft 18. In the normal condition, the clutch 26 is in the full engaged condition so that shaft 12 is mechanically coupled to shaft 18 to rotate the same. This is accomplished by providing a friction disc 40 secured to the back side of the crown gear 28 and engaging the clutch pressure plate 32. The pressure applied between the clutch pressure plate 32 and the friction disc 40 is sufficient, when considering the gear reduction arrangement between the crown gear 28 and the spur gear 30, to rotate the shaft 18 upon rotation of the manual drive shaft 12 manually to tune in any desired radio station. To disengage the gear reduction arrangement provided by crown gear 28 and spur gear 30, the clutch pressure plate 32 must be moved away from the friction disc 40. This is accomplished by a slidable cam plate 42 having an extended portion **42*a* turned at its end to engage an annular recess 44 formed in the hub 34. Rotation of the hub 34 is free and unobstructed and the extended portion 42 *a* engaged therewith may be lubricated, if desired. Therefore, as any one of the pushbuttons 14 is depressed it initially moves the slidable cam plate 42 so as to disengage the clutch pressure plate 32 from the friction disc 40** in a manner well-known in the art as disclosed in U.S. Pat. No. 2,811,045 to R. E. Thompson and assigned to the same assignee.

The tuner 10 may also include a potentiometer control 46 which may be used as a balance control for dual speaker systems or for the left and right channels of a stereo receiver and is controlled by an outer shaft 48 which embraces the manual drive shaft 12.

Figure 3:
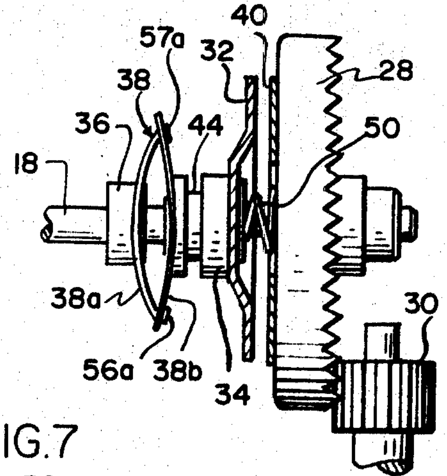
FIG. 3 is an enlarged assembled view of the shaft with the clutch pressure plate shown in an disengaged position with respect to a crown gear member mounted on the shaft.

The crown gear 28 is freely rotatable upon the clutch shaft 18 and only turns with the shaft 18 so long as the clutch mechanism 26 is in the engaged condition. A small spring 50 is positioned between the clutch pressure plate 32 and the crown gear 28, as best seen in FIG. 3, to insure a positive engagement of the crown gear 28 and the spur gear 30 when the clutch pressure plate 32 is in the disengaged condition, as best illustrated in FIG. 3.

Figure 2:
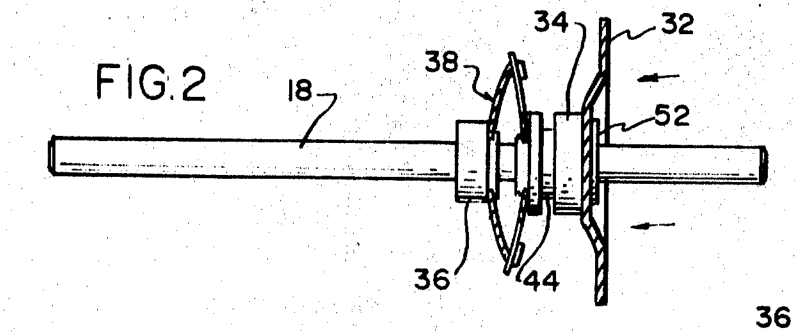
FIG. 2 is an enlarged partial sectional view of a shaft and flexible clevis fastened to a clutch pressure plate arrangement of this invention.
Figure 4:
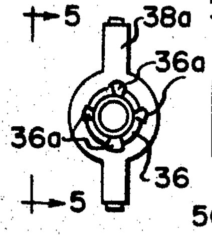
FIG. 4 is a front view of one element of the flexible clevis of this invention.
Figure 5:
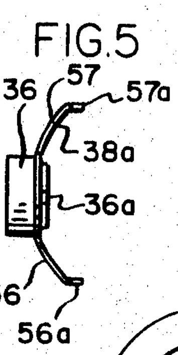
FIG. 5 is a side view taken along line 5—5 of FIG. 4.

Referring again to FIG. 3, the flexible clevis arrangement is more fully understood from the following detailed description. The hub member 36 is staked on the clutch shaft 18 and is in a fixed position with respect thereto during all operating conditions. On the other hand, the hub member 34 is annularly secured to the shaft 18 by way of the flexible clevis, but is readily axially shiftable with respect to the shaft 18 as a result of the slidable cam plate 42 engaging the recess of 44. FIG. 2 also illustrates that the clutch disc 32 is fastened to the hub 34 by a rolled over flange portion 52 extending from the hub 34 and through an opening in the disc 32. This flange portion 52 is expanded or rolled in a well-known manner to securely fasten these parts together. FIGS. 4 and 5 illustrate the male portion **38*a* of the clevis 38 and also shows the deformations 36*a* formed at various locations around the hub 36 to stake the hub to the male member 38*a*. The male clevis member 38*a* is formed of a spring-like metal substantially resilient or flexible and comprised radially outwardly and axially forward reaching arm members 56 and 57 being turned in at the end portions 56*a* and 57*a***, respectively.

Figure 6:
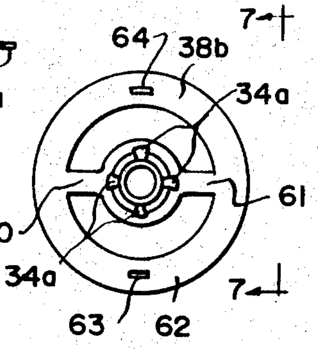
FIG. 6 is a front view of a second member of the flexible clevis of this invention.
Figure 7:
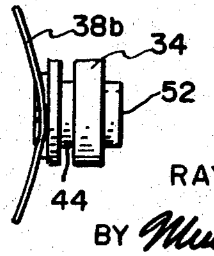
FIG. 7 is a side view taken along line 7—7 of FIG. 6.

FIGS. 6 and 7 illustrate the female portion **38*b* of the clevis 38 and connected to its hub 34 by deformations 34*a* formed at various locations about the hub. The female clevis member 38*b* is an annular member formed of spring-like metal with arm portions 60 and 61 extending outwardly from the hub 34 to support an axially flexible ring portion 62. The ring portion 62 has formed therein apertures 63 and 64 which receive the turned over portions 56*a* and 57*a*, respectively, of the male clevis member 38*a*** to hold these two parts together as seen in FIG. 3.

What has been described is a simple and efficient flexible clevis arrangement for holding a clutch pressure plate to a clutch shaft so that the pressure plate is annularly secured to the shaft but readily axially movable on the shaft.

I claim:

1. In a radio receiver having tuning means for selecting the desired radio station and positioning means connected to the tuning means for positioning the same, either by manipulation of a manual tuning control or by actuation of a pushbutton mechanism, the combination including:

a shaft having one end thereof coupled to the positioning means to move the same under the influence of manipulation of the manual tuning control;

clutch means on said shaft and having a pressure plate frictionally connecting said shaft to the manual tuning control for manual tuning of the radio receiver and for disconnecting said shaft from the manual tuning control during actuation of the pushbutton mechanism;

disengaging means connected between said clutch means and the pushbuttons of the tuner to disengage said clutch means upon actuation of a given pushbutton; and an axially flexible clevis having a first portion fixedly secured to said shaft and extending radially outwardly therefrom and a second annular portion slidably mounted on said shaft and being coupled to said pressure plate of said clutch means, said radially extending first portion of said clevis engaging said second annular portion to provide a symmetrical force on the pressure plate with respect to the shaft, whereby said clevis is axially resiliently movable upon said shaft in response to said movement of said disengaging means during actuation of the pushbutton mechanism to cause movement of said pressure plate, but remains fixed to said shaft to rotate the same upon manipulation of the manual tuning control.

2. The combination of claim 1 wherein said flexible clevis includes a first hub fixedly secured to said shaft;

a second hub axially movable on said shaft, said second hub being secured to said pressure plate of said clutch means to move the same axially on said shaft; and connecting means secured to said first and second hubs, said connecting means being axially flexible but substantially annularly rigid said connecting means including said first and second portions.

3. The combination of claim 1 wherein said first portion includes a first pair of radially outwardly extending arms of spring metal having inner portions thereof operatively secured to said shaft for rotation therewith; and said second portion includes a second pair of radially outwardly extending arms of spring metal, said second pair of arms terminating in an annular ring formed integrally therewith about said shaft, with the inner portion of said second pair of radially outwardly extending arms being fastened to said pressure plate of said clutch means.

4. The combination of claim 1 wherein said clutch means includes a crown gear rotatably mounted on said shaft;

friction means formed on said crown gear to engage said pressure plate; and a spur gear fastened to the manual tuning control and drivingly coupled to said crown gear to rotate the same when said pressure plate is in engagement with said friction means.

* * * * *